(12) United States Patent
Ito (10) Patent No.: US 9,478,542 B1
(45) Date of Patent: Oct. 25, 2016

(54) MULTI-GATE DEVICE WITH PLANAR CHANNEL

(71) Applicant: BROADCOM CORPORATION, Irvine, CA (US)

(72) Inventor: Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/817,141

(22) Filed: Aug. 3, 2015

Related U.S. Application Data (60) Provisional application No. 62/190,197, filed on Jul. 8, 2015.

(51) Int. Cl.
| | | |
|---|---|---|
| *H01L 27/088* | (2006.01) | |
| *H01L 21/02* | (2006.01) | |
| *H01L 21/70* | (2006.01) | |
| *H01L 29/66* | (2006.01) | |
| *H01L 29/06* | (2006.01) | |
| *H01L 29/10* | (2006.01) | |
| *H01L 21/265* | (2006.01) | |
| *H01L 21/8234* | (2006.01) | |

(52) U.S. Cl.
CPC ..... *H01L 27/0886* (2013.01); *H01L 21/26513* (2013.01); *H01L 21/823431* (2013.01); *H01L 21/823481* (2013.01); *H01L 21/823493* (2013.01); *H01L 29/0638* (2013.01); *H01L 29/0649* (2013.01); *H01L 29/1079* (2013.01)

(58) Field of Classification Search
CPC ............ H01L 27/0886; H01L 21/26513; H01L 21/823421; H01L 21/823481; H01L 21/823493; H01L 29/0638; H01L 29/0649; H01L 29/1079

USPC ................. 257/401, 384, 506, 656
See application file for complete search history.

(56) References Cited

U.S. PATENT DOCUMENTS

| | | | |
|---|---|---|---|
| 2005/0173768 A1* | 8/2005 | Lee ............... | H01L 29/4908 257/401 |
| 2007/0145431 A1* | 6/2007 | Kim ............... | H01L 29/42392 257/288 |
| 2007/0235818 A1* | 10/2007 | Anderson ........ | H01L 21/82380 257/401 |
| 2008/0265321 A1* | 10/2008 | Yu ................. | H01L 21/26586 257/344 |
| 2009/0095980 A1* | 4/2009 | Yu ................. | H01L 29/66795 257/190 |

* cited by examiner

*Primary Examiner* — Dzung Tran
(74) *Attorney, Agent, or Firm* — McDermott Will & Emery LLP (57) ABSTRACT

A semiconductor device includes a substrate having a well region implanted with a first dopant by a first well implantation and a non-doped section blocked from the first well implantation. The semiconductor device includes a semiconductor fin formed on the substrate, in which the semiconductor fin has a channel stop region and a channel region above the channel stop region. The channel stop region has a portion of the non-doped section and a portion of the well region. The semiconductor fin has a planar channel formed at an interface between the non-doped section and the channel region for additional current flow between source and drain regions of the semiconductor fin. The semiconductor device includes an isolation layer disposed adjacent to and in contact with the well region and the channel stop region. The semiconductor device also includes a gate structure disposed on the isolation layer and around the channel region.

20 Claims, 7 Drawing Sheets

MULTI-GATE DEVICE WITH PLANAR CHANNEL

CROSS-REFERENCE TO RELATED APPLICATION

The present application claims the benefit of U.S. Provisional Patent Application No. 62/190,197, entitled "MULTI-GATE DEVICE WITH PLANAR CHANNEL," filed Jul. 8, 2015, the contents of which are hereby incorporated by reference in its entirety for all purposes.

TECHNICAL FIELD

The present description relates generally to multi-gate semiconductor devices, and more particularly, but not exclusively, to fin-shaped field effect transistor (FinFET) devices and fabrication process thereof.

BACKGROUND

As semiconductor devices are increasing in layout density, technology scaling has led to development of fin-based, also referred to as FinFET structures as an alternative to bulk metal-oxide-semiconductor FET structures for improved scalability. The FinFET utilizes a semiconductor fin to wrap the conducting channel, and the fin forms the body of the transistor. In effect, the gate electrode of the transistor straddles or surrounds the fin. During operation, current flows between the source and drain terminals along the gated sidewall surfaces of the fin. The FinFET channel may be lightly doped which yields a low threshold voltage for the channel since the threshold voltage has a dependency upon the substrate bias.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations.

As used herein, the term "substrate" refers to the physical object that is the basic workpiece transformed by various process operations into the desired microelectronic configuration. A typical substrate used for the manufacture of integrated circuits is a wafer. Wafers may be made of semiconducting (e.g., bulk silicon), non-semiconducting (e.g., glass), or combinations of semiconducting and non-semiconducting materials (e.g., silicon-on-insulator (SOI)). In the semiconductor industry, a bulk silicon wafer is commonly used for the manufacture of integrated circuits.

As used herein, the term "gate structure" refers to an insulated gate terminal of a FET. The physical structure of the gate terminal is referred to as a gate electrode. "Source/drain (S/D) terminals" refer to the terminals of a FET between which conduction occurs under the influence of an electric field subsequent to inversion of the semiconductor surface under the influence of an electric field resulting from a voltage applied to the gate terminal of the FET. Generally, the source and drain terminals of a FET are fabricated such that the source and drain terminals are geometrically symmetrical. With geometrically symmetrical source and drain terminals, these terminals can be simply referred to as source/drain terminals. Chip designers often designate a particular source/drain terminal to be a "source" or a "drain" on the basis of the voltage to be applied to that terminal when the FET is operated in a circuit.

Figure 1A:
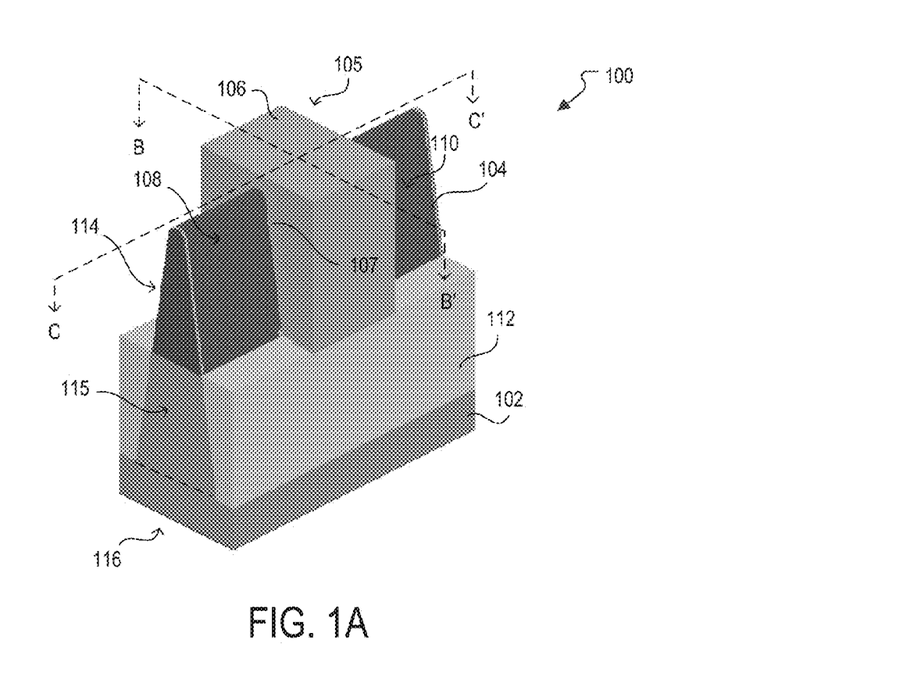
FIGS. 1A-1C illustrate a perspective view of a semiconductor device that includes a FinFET device and cross-sectional views of the FinFET device respectively along B-B' and C-C' in accordance with one or more implementations.
Figure 1B:
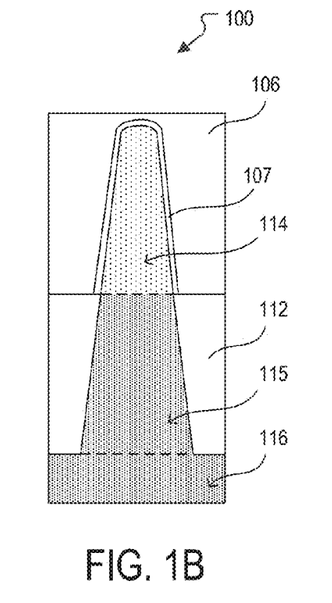
Figure 1C:
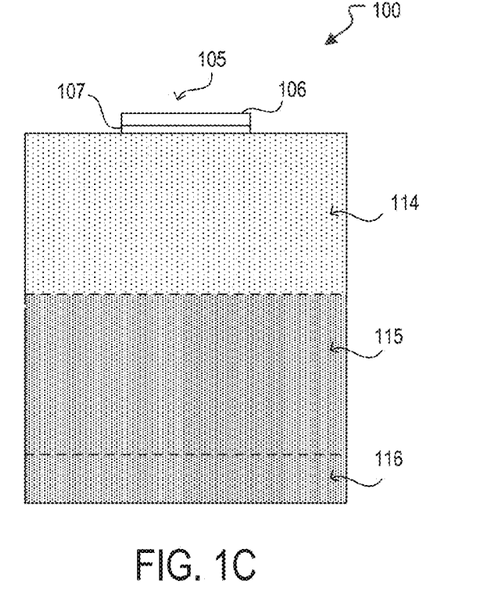

FIGS. 1A-1C illustrate a perspective view of a semiconductor device that includes a FinFET device 100 and cross-sectional views of the FinFET device respectively along B-B' and C-C' in accordance with one or more implementations. FIG. 1B illustrates a cross-sectional view of the FinFET device 100 which is orthogonal to the cross-sectional view of the FinFET device 100 illustrated in FIG. 1C. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

The FinFET device 100 includes a substrate 102 supporting a semiconductor fin structure 104 and a gate structure 105. The semiconductor fin structure 104 includes a source region 108 and a drain region 110. In one or more implementations, the FinFET device 100 includes wells and shallow trench isolation (STI) regions. As shown in FIGS.

1A-IC, the semiconductor fin structure 104 includes a channel region 114 and a channel stop region 115, and the substrate 102 includes a well region 116. In addition, the FinFET device 100 includes an isolation layer 112. As shown in FIGS. 1A-IC, the doping density of the channel stop region 115 is the same as that of the well region 116. The doping density of the channel region 114 may be different from the doping density of the channel stop region 115. For example, the doping density of the channel stop region 115 may be greater than that of the channel region 114. The doping density of the channel region 114 may be in the range of about $1 \times 10^{15}$ cm$^{-3}$ to $1 \times 10^{21}$ cm$^{-3}$. Similarly, the doping density of the channel stop region 115 may be in the range of about $1 \times 10^{17}$ cm$^{-3}$ to $1 \times 10^{21}$ cm$^{-3}$.

The gate structure 105 is deposited over a portion of the semiconductor fin structure 104 to form the channel region 114 between the source region 108 and the drain region 110. In effect, the gate structure 105 straddles or surrounds the semiconductor fin structure 104. During operation, current flows between the source region 108 and the drain region 110 along the gated sidewall surfaces of the semiconductor fin structure 104. In one or more implementations, the gate structure 105 includes a gate electrode layer 106 and a gate dielectric layer 107 disposed between the gate electrode layer 106 and the channel region 114. The gate structure 105 may include one or more work function gate metal layers (not shown). In one or more implementations, the work function gate metal layers can include, but is not limited to, titanium carbide, titanium aluminide, tantalum nitride, titanium nitride, tungsten nitride, iridium dioxide, among other metals identifiable by a person skilled in the art. The work function gate metal layers may be doped. In one or more implementations, the FinFET device 100 includes epitaxially-grown structures (not shown) formed outside of the gate structure 105, respectively referred to as the source region 108 and the drain region 110. The epitaxially-grown structures may be heavily doped compared to the channel region 114.

Although one semiconductor fin structure 104 is shown in FIGS. 1A-IC, in one or more implementations, additional semiconductor fin structures can be disposed on the substrate 102. In one or more implementations, the gate structure 105 can straddle or surround a plurality of semiconductor fin structures. In one or more implementations, more than one gate structure can straddle or surround one or more semiconductor fin structures. In one or more implementations, the gate structure 105 is formed using a polysilicon material or a metal.

The substrate 102 may be p-type or n-type depending on implementation. The FinFET device 100 may be a p-type metal-oxide-semiconductor (PMOS) structure such that the substrate 102 is a p-type substrate made of p-type material. The p-type material may be obtained by a doping process by adding certain types of atoms to the semiconductor (e.g., boron as dopant in silicon substrate) in order to increase the number of positive carriers (e.g., holes). Alternatively, the FinFET device 100 may be an n-type MOS (NMOS) structure such that the substrate 102 is an n-type substrate made of n-type material (e.g., arsenic or phosphorus as dopant in silicon substrate).

Because the physical depictions of the FinFET device 100 is not limited to the implementation shown in FIGS. 1A-IC, the FinFET device 100 may be applicable to double-gate transistors, tri-gate transistors, and various other implementations of semiconductor devices. The FinFET device 100 may be applicable to various technologies including, but not limited to, complementary metal-oxide-semiconductors (CMOS), silicon (Si), strained silicon, silicon-on-insulator (SOI), gallium-arsenide (GaAs), indium-gallium-arsenide (InGaAs), silicon-germanium (SiGe), and other Group IV elements/compounds and Group III-V compounds.

In many cases, the FinFET channel (e.g., the channel region 114) is fully depleted in an "off" state which causes relatively little body effect through the FinFET channel. Because the FinFET channel is fully depleted in the "off" state, there is a linear relationship between the threshold voltage and the work function of the gate electrode layer 106. For low threshold voltage devices, multiple work function gate metal layers are needed. However, there is a substantial cost associated with the addition of multiple work function gate metal layers, which is typically required for analog and input/output (I/O) designs. In other cases, the FinFET channel may be lightly doped which yields a low threshold voltage for the FinFET channel since the threshold voltage has a dependency upon the substrate bias (e.g., doping on the substrate 102). In this regard, there is a relationship between the fin doping density and the threshold voltage of the FinFET channel.

The subject technology includes techniques for forming a planar channel in multi-gate devices, particularly FinFET devices. In one or more implementations, the subject technology achieves lower threshold devices by forming a planar channel under the FinFET channel. By blocking a section of the substrate under the FinFET channel from a well implantation, the formed planar channel has a significantly lower doping concentration compared to the rest of the well layer of the semiconductor fin structure and surrounding well layer. The blocked section allows an increase in current flow through the planar channel thereby allowing a decrease in achievable threshold voltages for the FinFET device without the need of adding expensive work function gate metal layers. In this regard, the threshold voltage has a non-linear relationship with the width size of the blocked section such that the threshold voltage decreases when the width of the blocked section increases along a longitudinal axis of the semiconductor fin structure. The advantageous features of the disclosure also include compatibility with existing FinFET-based and laterally diffused MOS (LDMOS)-based CMOS device fabrication process flows without requiring any additional masks.

Figure 2A:
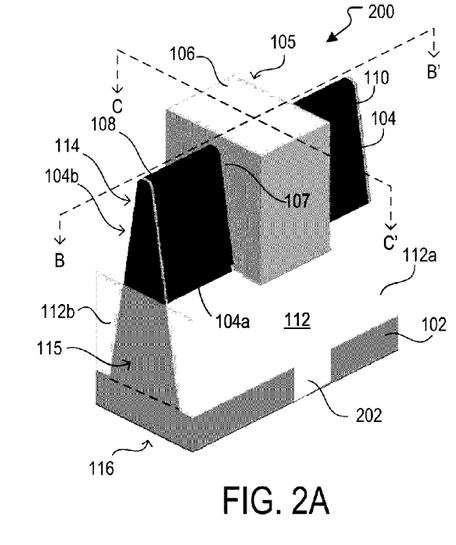
FIGS. 2A-2D illustrate a perspective view of a semiconductor device that includes a FinFET device and various cross-sectional views of the FinFET device in accordance with one or more implementations.
Figure 2B:
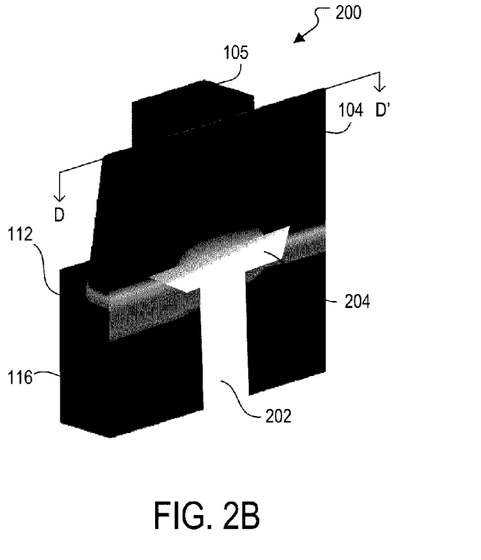
Figure 2C:
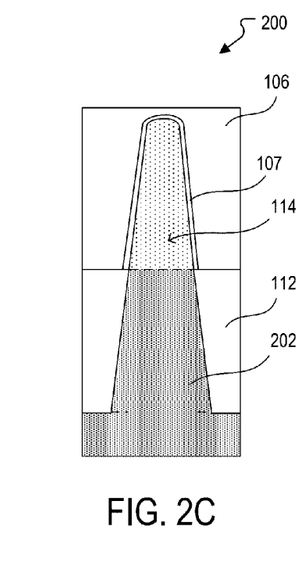
Figure 2D:
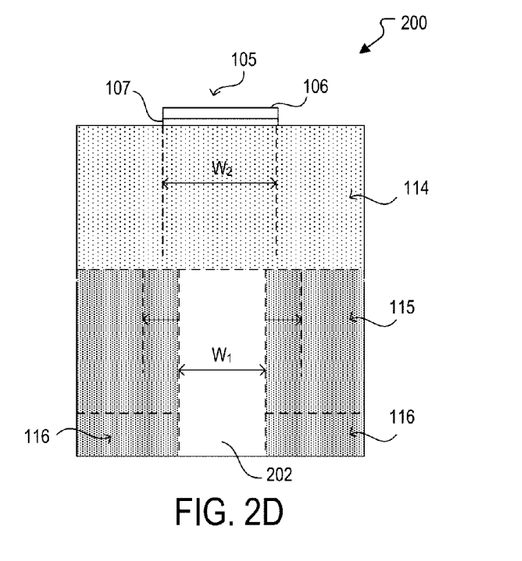

FIGS. 2A-2D illustrate a perspective view of a semiconductor device that includes a FinFET device 200 and various cross-sectional views of the FinFET device in accordance with one or more implementations. FIG. 2B illustrates a perspective cross-sectional view of the FinFET device 200 which is orthogonal to the cross-sectional view of the FinFET device 200 illustrated in FIG. 2C. FIG. 2D illustrates a cross-sectional view of the FinFET device 200 which is also orthogonal to the cross-sectional view of the FinFET device 200 illustrated in FIG. 2C. Not all of the depicted components may be required, however, and one or more implementations may include additional components not shown in the figure. Variations in the arrangement and type of the components may be made without departing from the scope of the claims as set forth herein. Additional components, different components, or fewer components may be provided. In any implementation, what is shown as one layer of material (e.g., dielectric layer, metal layer, and so forth) may be realized with multiple layers of materials, where each layer may be of a thickness and/or material different from an adjacent layer.

The FinFET device 200 includes a substrate 102, such as a silicon (Si) substrate. The FinFET device 200 also includes a semiconductor fin structure 104 having a channel region 114 and a channel stop region 115. The substrate 102 also includes the gate structure 105, the isolation layer 112 and the well region 116. In fabricating the FinFET device 200, the substrate 102 receives n-type dopants or p-type dopants during a well implantation depending on the type of semiconductor device targeted. In some aspects, the well implantation is performed prior to the semiconductor fin structure 104 patterning. In other aspects, the well implantation is performed following the semiconductor fin structure 104 patterning but prior to the formation of the gate structure 105.

Prior to the well implantation, a mask layer is formed on the substrate 102. In this embodiment, the mask layer is applied prior to the substrate 102 being patterned. A layer of masking material such as photoresist may be deposited and patterned using semiconductor fabrication techniques to define regions protected by the masking material and regions not protected by the masking material. The mask layer may be patterned such that a section of the substrate 102 is blocked from the well implantation; hence a non-doped section 202. In this regard, the blocked section contains no doping concentration (if not negligible doping concentration) compared to the remainder of the substrate 102.

The substrate 102 may be initially patterned to deposit the mask layer into a recessed substrate portion such that the mask layer is conformal with the top surface of the substrate 102. In one or more implementations, a dummy semiconductor material (not shown) and one or more spacers (not shown) are deposited into the recessed substrate portion. In this example, the substrate 102 is recessed deep enough to support the dummy semiconductor material. The mask layer may be disposed on the dummy semiconductor material. In one or more implementations, the dummy semiconductor material including the one or more spacers are removed after the one or more well implantations are performed, and a non-doped semiconductor material (or native semiconductor material) is disposed into the recessed substrate region; hence representing the non-doped section 202.

In one or more implementations, doping by a well implantation is performed to implant dopants into the substrate 102 in regions not covered by the mask layer. Specifically, portions of the substrate 102 beneath the top surface are doped to form a doped substrate 102 (or a well region 116). The doping may be performed using one or more doping operations such as an ion implantation with a defined ion dosage. The doping can be n-type doping or p-type doping depending on implementation. It is noted that, although not shown in FIGS. 2A-2D, doping can also be performed in regions outside of the well region 116, where the doping can be, but need not be, different from the doping performed in the well region 116. In one or more implementations, the doping may utilize an in-situ conformal doping source (e.g., material is doped when grown) such as a doped oxide.

As shown in FIG. 2B, the substrate 102 has at least one well region implanted with a first dopant by the well implantation and the non-doped section 202 blocked from the well implantation. A section of the channel stop region 115 and the well region 116 intended to be beneath the gate structure along a longitudinal axis of the semiconductor fin structure 104 is blocked from the well implantation. In this regard, a planar channel 204 is formed along the longitudinal axis of the semiconductor fin structure 104 at the base of the channel region 114 (or at an interface between at least a portion of the non-doped section 202 and the channel region 114). For example, the planar channel 204 can be formed by a gate fringe electric field and drain-induced barrier lowering (DIBL) effect generated by the blocking of well implants at the sections of the channel stop region 115 and the well region 116. As a result, additional drive current flow can be observed through the planar channel 204 (or between the source region 108 and the drain region 110) thereby impacting the threshold voltage of the FinFET device 200. In this case, increasing a width ($W_1$) of the non-doped section 202 along the longitudinal axis decreases the threshold voltage of the FinFET device 200. This is because the section beneath the gate structure 105 blocked from well implants contains no doping which allows additional current to flow across the channel region 114 compared to sections of the channel stop region 115 containing significantly higher doping concentrations.

In one or more implementations, a hardmask material is deposited and patterned using semiconductor fabrication techniques to form hardmask mandrels (not shown) on the top surface of the substrate 102. In one or more implementations, the patterning is performed using sidewall image transfer (SIT). The hardmask material can be, by way of example and not of limitation, oxide (e.g., silicon oxide) or nitride (e.g., silicon nitride).

In one or more implementations, etching is performed on the substrate 102 to remove one or more portions of the substrate 102 based on locations of the hardmask mandrels In this regard, the substrate 102 is patterned by an etch operation to form one or more trenches in the substrate 102 and thus define one or more semiconductor fin structures 104, after which the hardmask mandrels are removed. For example, the remaining substrate material (or standing structure) represents the semiconductor fin structure 104. In some aspects, more than one semiconductor fin structure can be formed (or patterned) on the substrate 102. The substrate 102 which is etched to define the semiconductor fin structure 104 may be composed of silicon material. Other materials such as gallium-arsenide, silicon-germanium, among other suitable substrate materials identifiable by a person skilled in the art may also be utilized in the process, in accordance with one or more implementations.

In one or more implementations, etching is performed to remove the mask layer used to block one or more portions of the substrate 102 during the well implantation. The etching also may be used to remove the hardmask material (e.g., the hardmask mandrels) used to pattern the semiconductor fin structure 104.

As shown in FIG. 2C, the semiconductor fin structure 104 formed on the substrate 102 includes the channel stop region 115 and the channel region 114 above the channel stop region 115. The channel stop region 115 has at least a portion of the non-doped section 202 and at least a portion of the well region 116. The semiconductor fin structure 104 includes the planar channel 204 formed at the interface between the at least a portion of the non-doped section 202 and the channel region 114. For example, at least a portion of the channel region 114 beneath the gate structure 105 is directly above the at least a portion of the non-doped section 202.

The gate structure 105 may be disposed on at least a portion of the isolation layer 112 and around at least a portion of the channel region 114. The gate structure 105 may remain in place as the final gate structure of the FinFET device 200, or the gate structure 105 may be removed and replaced with alternative gate dielectric and/or gate electrode materials. Gate replacement processes, for example high-k metal gate (HKMG), are well-known in the semiconductor manufacturing field and are not further described herein.

As shown in FIG. 2D, the gate structure 105 includes a width ($W_2$) and the non-doped section 202 includes a width ($W_1$). In some aspects, the width of the non-doped section 202 is greater than that of the gate structure 105 ($W_2$). The width of the non-doped section 202 may be in a range of about at least 1 nanometer (nm) up to a width corresponding to a desired threshold voltage. In this example, the width that causes the threshold voltage to reach zero may be the maximum width size of the non-doped section 202.

In one or more implementations, the semiconductor fin structure 104 includes a first sidewall 104a and a second sidewall 104b, where the second sidewall 104b is opposite of the first sidewall 104a. The first sidewall 104a of the semiconductor fin structure 104 is adjacent to and in contact with an isolation region 112a disposed on a top surface of the substrate 102, and the second sidewall 104b of the semiconductor fin structure 104 is adjacent to and in contact with an isolation region 112b disposed on the top surface of the substrate 102.

In some aspects, the isolation layer 112 is disposed on the top surface of the substrate 102 and thereafter recessed using an etch operation (e.g., wet etch or dry etch) to form the isolation regions 112a, 112b. The isolation layer 112 may be disposed within the trenches surrounding the semiconductor fin structure 104. For example, the isolation layer 112 may be disposed adjacent to and in contact with at least the well region 116 and the channel stop region 115. In one or more implementations, the isolation layer 112 includes one or more layers of a high-k dielectric material and/or an oxide insulator material. For example, one or more layers of oxide material are deposited on the top surface of the substrate 102. The high-k dielectric material can include, but is not limited to, hafnium oxide, hafnium silicon oxide, lanthanum oxide, lanthanum aluminum oxide, yttrium oxide, lead zinc niobate, among other high-k dielectric materials identifiable by a person skilled in the art.

In one or more implementations, the oxide material can be deposited utilizing a molecular vapor deposition (MVD) process, although other suitable deposition processes may be utilized. The oxide material may be an oxide suitable for filling the trenches between formed (or patterned) semiconductor fin structures. The oxide material may have a low etch rate (such as a low hydrofluoric acid etch rate). Silicon dioxide ($SiO_2$) is generally used as the oxide material, although other suitable oxides can be used. The oxide material can be deposited utilizing a process such as a chemical vapor deposition (CVD), low pressure chemical vapor deposition (LPCVD), molecular layer deposition (MLD), among others.

The oxide material in the isolation regions 112a, 112b that is not protected by masking material is etched to yield a certain thickness of oxide material. In this embodiment, the channel region 114 is above the isolation layer 112 while the well region 116 is below a top surface of the isolation layer 112. The one or more layers of oxide material may be recessed as part of a shallow trench isolation (STI) process. The thickness of the recessed oxide material can be between 30 nm and 80 nm.

The gate structure 105 may be referred to as the "active" gate because during operation of a completed chip, the gate structure 105 receives a signal that controls electrical conduction between the source region 108 and the drain region 110. The current path between the source region 108 and the drain region 110 includes the semiconductor fin structure 104, the well region 116 and the non-doped section 202 via the planar channel 204.

The semiconductor fin structure 104 has a threshold voltage that is directly proportional to a width ($W_1$) of the non-doped section 202. In this regard, if the width increases (thereby allowing additional current flow through the planar channel), the threshold voltage of the FinFET device 200 decreases. For example, the threshold voltage corresponding to a first width of the non-doped section 202 would be smaller than a second threshold voltage corresponding to a second width of the non-doped section when the first width is greater than the second width. In this example, the additional current flow through the planar channel would be greater for the first width of the non-doped section 202 than for the second width of the non-doped section 202. In contrast to the FinFET device 100 of FIG. 1, the FinFET device 200 may be implemented without the need of adding work function gate metal layers; thus eliminating unnecessary cost to the fabrication process.

Figure 3A:
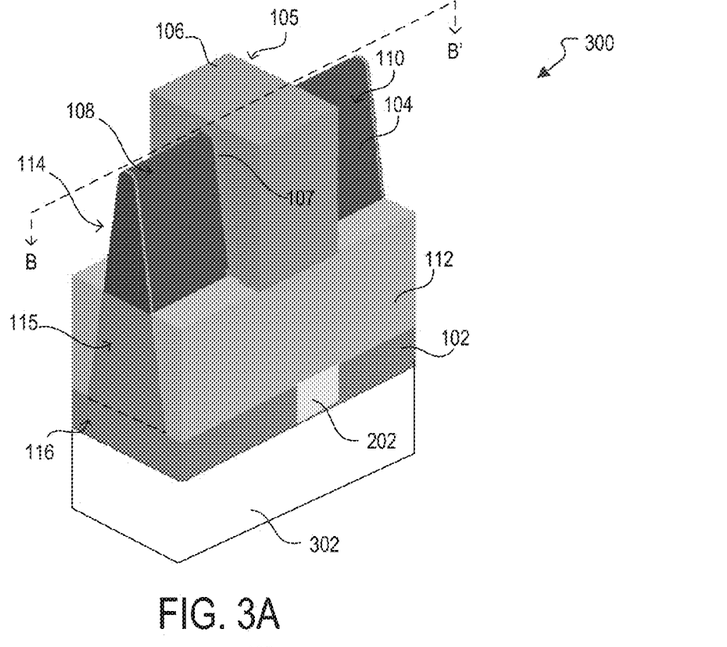
FIGS. 3A and 3B illustrate a perspective view of a semiconductor device that includes a FinFET device with a deep n-well layer and a cross-sectional view of the FinFET device along B-B' in accordance with one or more implementations.
Figure 3B:
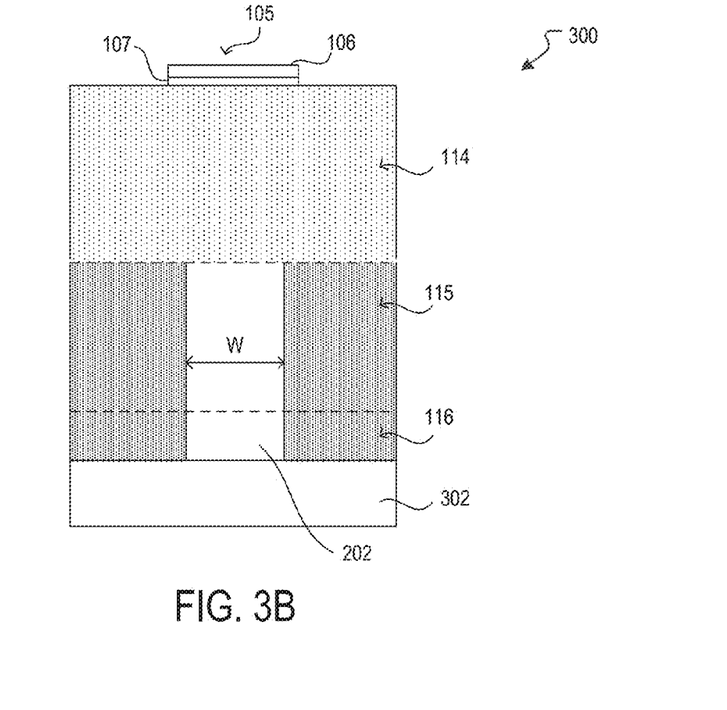

FIGS. 3A and 3B illustrate a perspective view of a semiconductor device that includes a FinFET device 300 with a deep n-well layer and a cross-sectional view of the FinFET device along B-B' in accordance with one or more implementations. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

Because the features described in FIGS. 2A and 2B are similar to the features of FIGS. 3A and 3B, only differences between the figures will be described in reference to FIGS. 3A and 3B. In one or more implementations, the FinFET device 300 includes a deep n-well (DNW) layer 302. In this regard, the threshold voltage for an n-type FinFET device can be further reduced by a relatively larger current path present through the planar channel 204 due to the DNW layer 302. In some aspects, the DNW layer 302 is in contact with the substrate 102 such that the DNW layer 302 is disposed between the well region 116 and the substrate 102.

By way of example, the semiconductor fin structure 104 would have a smaller threshold voltage with the DNW layer 302 disposed on the substrate 102 compared to the FinFET device 200 having a same width of the non-doped section 202. This is because the DNW layer 302 causes a larger current path to form through the planar channel 204. In contrast to the FinFET device 100 of FIG. 1, the FinFET device 300 may be implemented without the need of adding work function gate metal layers; thus eliminating unnecessary cost to the fabrication process.

Figure 4A:
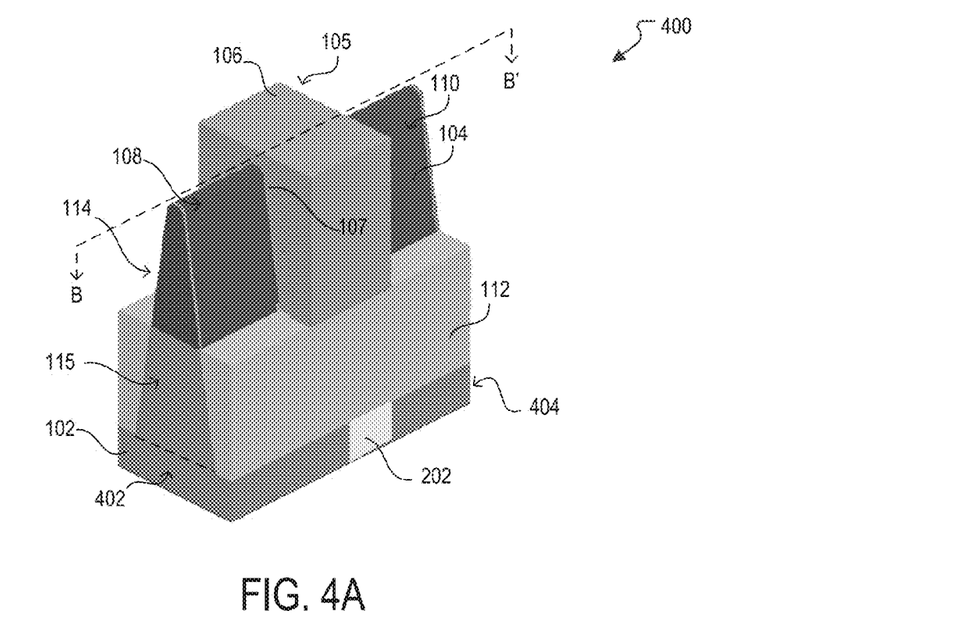
FIGS. 4A and 4B illustrate a perspective view of an example of a laterally-diffused metal-oxide semiconductor (LDMOS) FinFET device and a cross-sectional view of the LDMOS FinFET device along B-B' in accordance with one or more implementations.
Figure 4B:
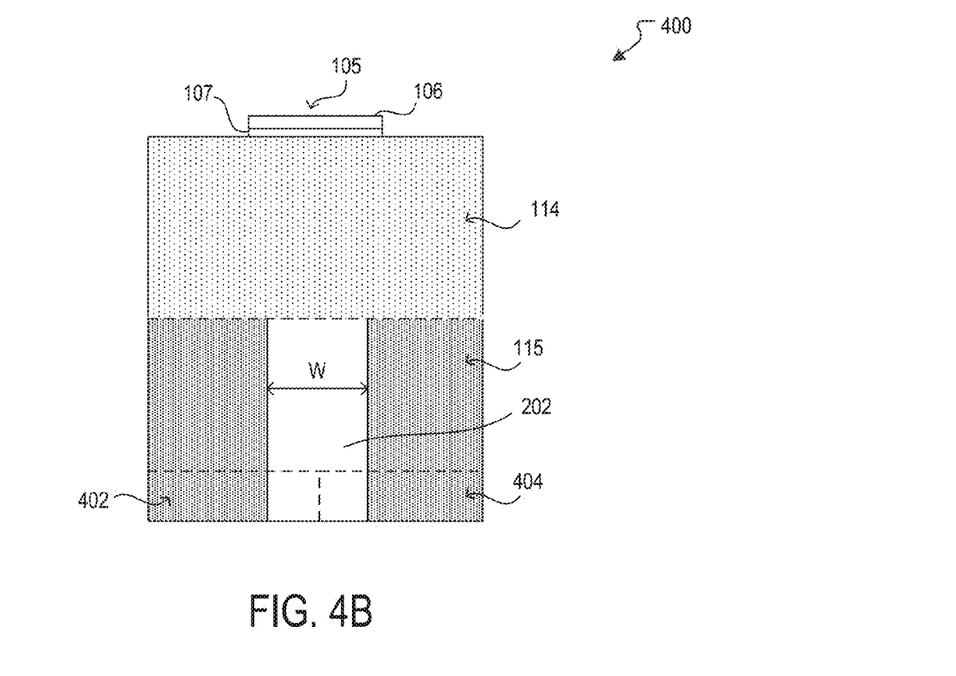

FIGS. 4A and 4B illustrate a perspective view of an example of a laterally-diffused metal-oxide semiconductor (LDMOS) FinFET device 400 and a cross-sectional view of the LDMOS FinFET device along B-B' in accordance with one or more implementations. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

Because the features described in FIGS. 2A and 2B are similar to the features of FIGS. 4A and 4B, only differences between the figures will be described in reference to FIGS. 4A and 4B. The FinFET device 400 is a LDMOS bulk FinFET device where a section of the channel stop region 115 and a first well region 402 under the gate structure 105 are blocked from a first well implantation. Similarly, a section of a second well region 404 under the gate structure 105 can be blocked from a second well implantation.

The first and second well implantations may be directed to different types of dopants (e.g., n- or p-type). In this case, blocking the channel stop region 115 along with the first well region 402 (e.g., n-well) and the second well region 404 (e.g., p-well) under the gate structure 105 would drive the threshold voltage lower for LDMOS-based FinFET structures.

The drain region 110 is designated on the semiconductor fin structure 104 at one side of the gate structure 105, and the source region 108 is designated on the semiconductor fin structure 104 at the other side of the gate structure 105. A first well region 402 (e.g., an n-well) implanted with a first dopant (n-type) by a first well implantation is disposed in the substrate 102. In addition, a second well region 404 implanted with a second dopant (p-type) by a second well implantation is disposed in the substrate 102. In this embodiment, the second well region 404 is located adjacent to the first well region 402 along a channel axis of the semiconductor fin structure 104. The first well region 402 and the second well region 404 may respectively have a doping concentration in a range of about $1 \times 10^{17}/cm^3$ to about $5 \times 10^{18}/cm^3$. In this embodiment, the substrate 102 is a p-type wafer with a sheet resistivity in a range of about 8 Ω-cm to about 15 Ω-cm but the sheet resistivity may vary in range depending on implementation.

Shallow trench isolation structures (not shown) may be disposed in near-surface portions of the first well region 402 and the second well region 404. In this embodiment the first well region 402 abuts the second well region 404. The location of boundary between an abutted n-well and p-well can be under the semiconductor fin structure 104 or the gate structure 105.

The channel stop region 115 in the FinFET device 400 has a portion blocked from the first well implantation and the second well implantation; hence the non-doped section 202. Similar to the FinFET device 200, the semiconductor fin structure 104 has the planar channel 204 formed at an interface between the non-doped section 202 and the channel region 114 for additional current flow between the source region 108 and the drain region 110 of the semiconductor fin structure 104 thereby decreasing the threshold voltage of the FinFET device 400. During operation, current flows between the source region 108 and the drain region 110. The current path between the source region 108 and the drain region 110 includes the semiconductor fin structure 104, the first well region 402, the second well region 404 and the non-doped section 202 via the planar channel 204. In contrast to the FinFET device 100 of FIG. 1, the FinFET device 400 may be implemented without the need of adding work function gate metal layers; thus eliminating unnecessary cost to the fabrication process.

Figure 5A:
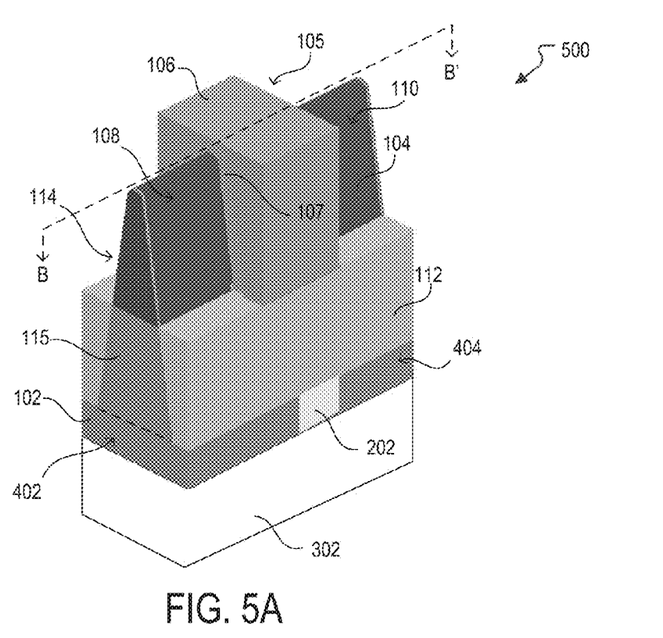
FIGS. 5A and 5B illustrate a perspective view of an example of a laterally-diffused metal-oxide semiconductor (LDMOS) FinFET device with a deep n-well layer and a cross-sectional view of the LDMOS FinFET device with the deep n-well layer along B-B' in accordance with one or more implementations.
Figure 5B:
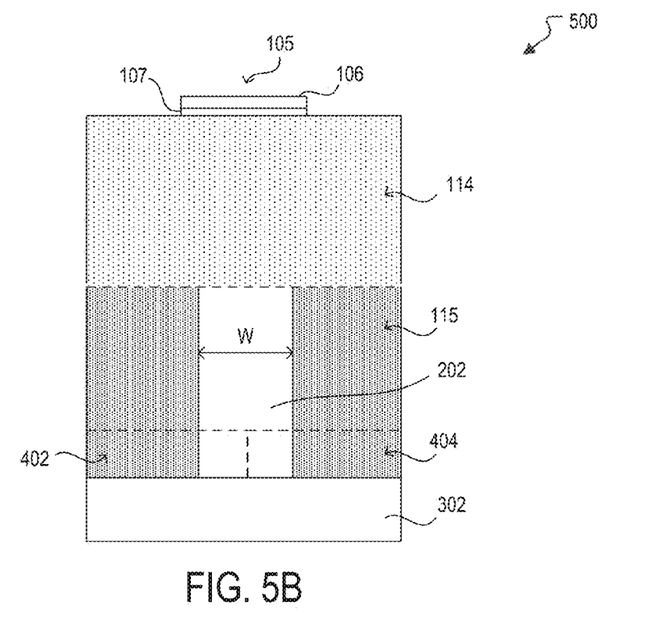

FIGS. 5A and 5B illustrate a perspective view of an example of a laterally-diffused metal-oxide semiconductor (LDMOS) FinFET device with a deep n-well layer and a cross-sectional view of the LDMOS FinFET device with the deep n-well layer along B-B' in accordance with one or more implementations. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

Because the features described in FIGS. 4A and 4B are similar to the features of FIGS. 5A and 5B, only differences between the figures will be described in reference to FIGS. 5A and 5B. In one or more implementations, the FinFET device 500 includes a deep n-well (DNW) layer 302. In this regard, the threshold voltage for an n-type FinFET device can be further reduced by a relatively larger current path present through the planar channel 204 due to the DNW layer 302. In some aspects, the DNW layer 302 is in contact with the substrate 102 such that the DNW layer 302 is disposed beneath the first well region 402 and the second well region 404.

Having the DNW layer 302 in the FinFET device 500 causes a larger current path to form through the planar channel 204. In contrast to the FinFET device 100 of FIG. 1, the FinFET device 500 may be implemented without the need of adding work function gate metal layers; thus eliminating unnecessary cost to the fabrication process.

Figure 6:
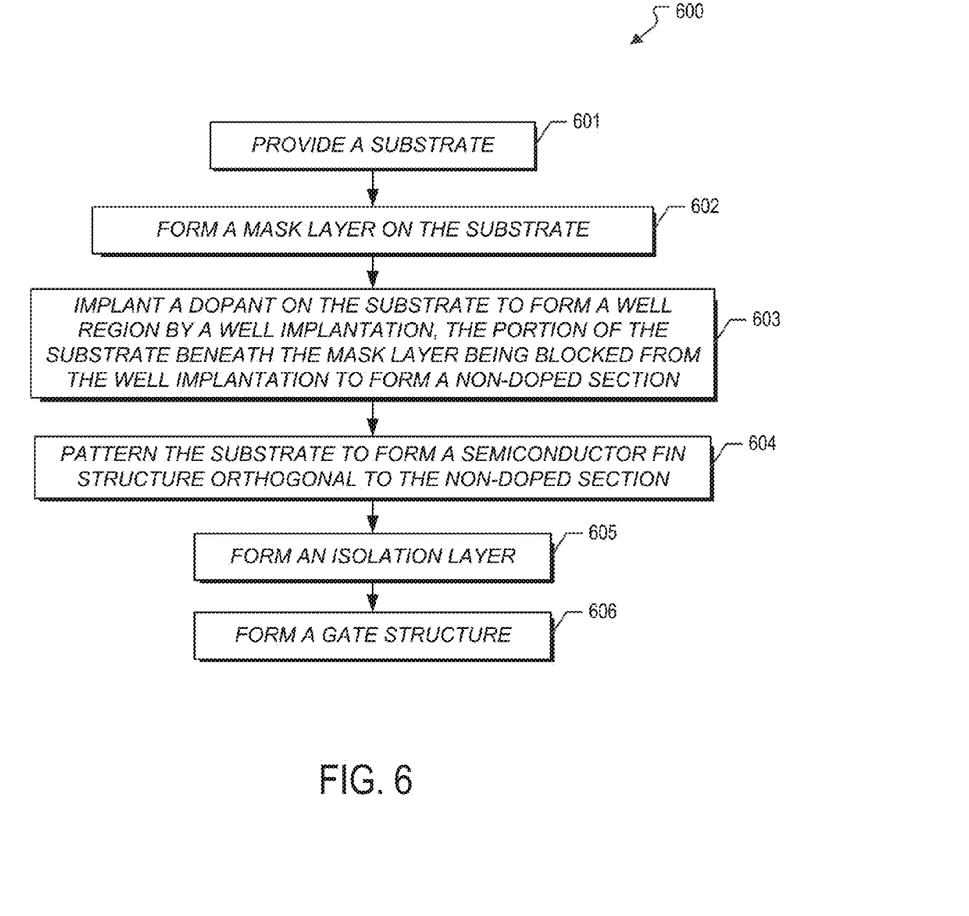
FIG. 6 illustrates a sequential fabrication process for forming the FinFET device of FIG. 2A in accordance with one or more implementations.

FIG. 6 illustrates a sequential fabrication process 600 for forming the FinFET device of FIG. 2A in accordance with one or more implementations. Further for explanatory purposes, the blocks of the sequential fabrication process 600 are described herein as occurring in serial, or linearly. However, multiple blocks of the sequential fabrication process 600 may occur in parallel. In addition, the blocks of the sequential fabrication process 600 need not be performed in the order shown and/or one or more of the blocks of the sequential fabrication process 600 need not be performed. Also, other fabrication operations may be introduced.

In this embodiment, the sequential fabrication process 600 relates to fabricating a semiconductor device including a FinFET device with a planar channel. The sequential fabrication process 600 includes providing a substrate (601). The sequential fabrication process 600 includes forming a mask layer on at least a first portion of the substrate (602). The sequential fabrication process 600 includes implanting a dopant on the substrate to form a well region in the substrate by a well implantation (603). In one or more implementations, the at least a portion of the substrate beneath the mask layer is blocked from the well implantation to form a non-doped section.

The sequential fabrication process 600 includes patterning the substrate to form one or more semiconductor fin structures on the substrate orthogonal to the non-doped section (604). In one or more implementations, the one or more semiconductor fin structures respectively have a channel stop region and a channel region above the channel stop region. The channel stop region has at least a portion of the non-doped section and at least a portion of the well region. The channel region may be directly above the at least a portion of the non-doped section. In one or more aspects, the one or more semiconductor fin structures respectively have a planar channel formed along a longitudinal axis of the channel region at an interface between the at least a portion of the non-doped section and the channel region for additional current flow through the planar channel. The one or more semiconductor fin structures can respectively have a threshold voltage decrease based on an increase in size of the at least a portion of the non-doped section along the longitudinal axis.

The sequential fabrication process 600 includes forming an isolation layer adjacent to and in contact with at least the well region and the channel stop region (605). The sequential fabrication process 600 also includes forming a gate structure on at least a portion of the isolation layer and around at least a portion of the channel region (606).

In some aspects, the sequential fabrication process 600 includes recessing a portion of the substrate to form a recessed region and disposing the mask layer into the recessed region as part of the forming of the mask layer. Alternatively, the sequential fabrication process 600 may include disposing a dummy material into the recessed region. The mask layer may then be disposed on the dummy material. The sequential fabrication process 600 also may include removing the dummy material after the implanting of the well region. Thereafter, a semiconductor material may be disposed into the recessed region as the non-doped section.

In some aspects, the sequential fabrication process 600 includes removing the mask layer by an etch operation before the gate structure is formed. Alternatively, the mask layer may be removed before the patterning of the substrate.

In some aspects, the sequential fabrication process 600 includes patterning the substrate to form one or more semiconductor structures as part of the patterning of the substrate. A dielectric material may then be disposed around and in contact with the one or more semiconductor structures. The patterning may include recessing the one or more semiconductor structures to form respective recessed regions. A semiconductor material may then be disposed into the respective recessed regions to form the one or more semiconductor fin structures. Thereafter, the dielectric material may be recessed to form the isolation layer. The patterning also includes implanting a second dopant on the semiconductor material to form the channel region by a channel implantation. The channel region may have a doping concentration smaller than that of the channel stop region and the well region. The channel stop region may have a doping concentration same as that of the well region.

The sequential fabrication process 600 may include forming a deep n-well layer on the substrate to allow further additional current through the planar channel thereby providing a lower threshold voltage for the FinFET device. In this embodiment, the deep n-well layer may be disposed between the well region and the substrate.

Figure 7:
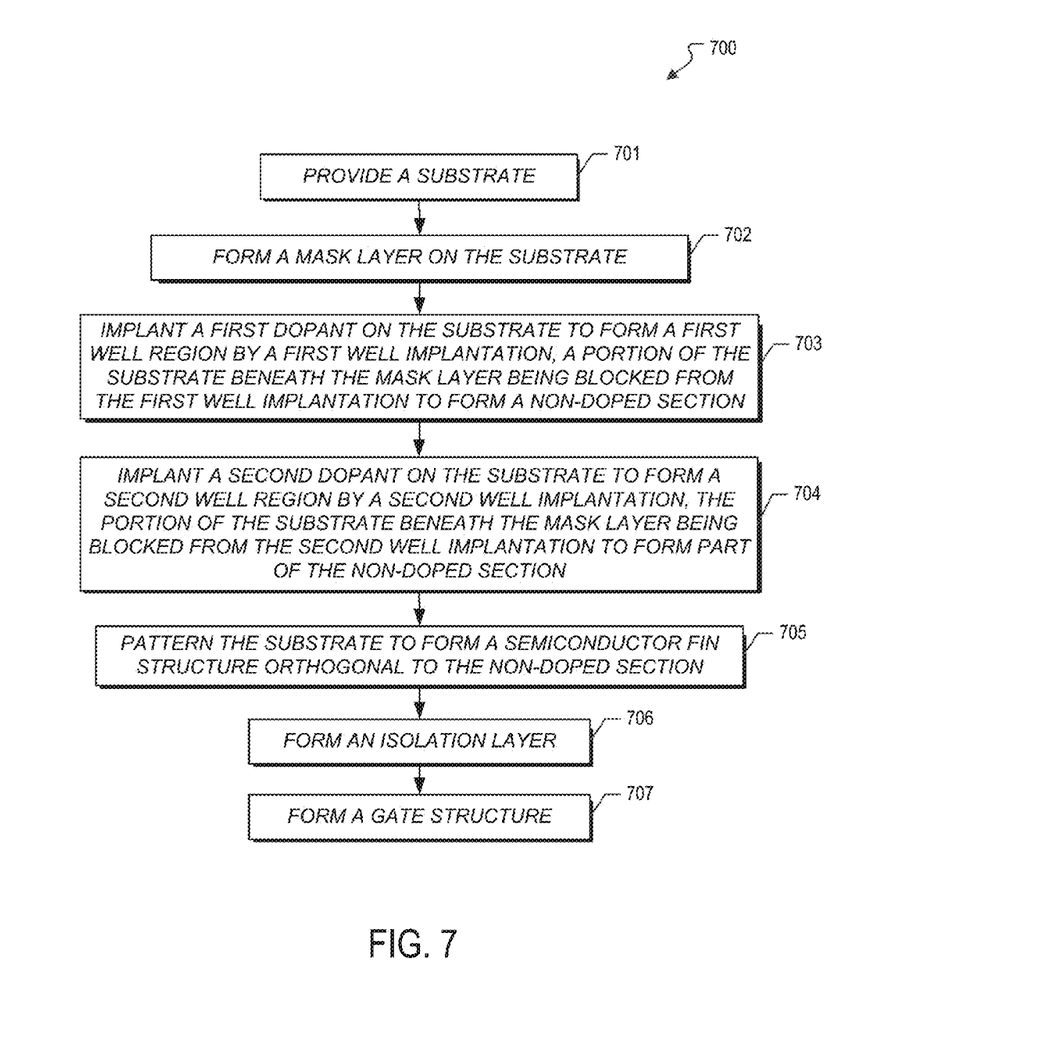
FIG. 7 illustrates a sequential fabrication process for forming the FinFET device of FIG. 4A in accordance with one or more implementations.

FIG. 7 illustrates a sequential fabrication process 700 for forming the FinFET device of FIG. 4A in accordance with one or more implementations. Further for explanatory purposes, the blocks of the sequential fabrication process 700 are described herein as occurring in serial, or linearly. However, multiple blocks of the sequential fabrication process 700 may occur in parallel. In addition, the blocks of the sequential fabrication process 700 need not be performed in the order shown and/or one or more of the blocks of the sequential fabrication process 700 need not be performed.

In this embodiment, the sequential fabrication process 700 relates to fabricating a semiconductor device including a FinFET device with a planar channel. The sequential fabrication process 700 includes providing a substrate (701). The sequential fabrication process 700 includes forming a mask layer on at least a first portion of the substrate (702).

The sequential fabrication process 700 includes implanting a first dopant on the substrate to form a first well region in the substrate by a first well implantation (703). In one or more implementations, the at least a portion of the substrate beneath the mask layer is blocked from the first well implantation to form a non-doped section.

The sequential fabrication process 700 includes implanting a second dopant on the substrate to form a second well region in the substrate by a second well implantation (704). In this embodiment, the second dopant (e.g., p-type material) is different from the first dopant (e.g., n-type material). In one or more implementations, the at least a portion of the substrate beneath the mask layer is blocked from the second well implantation to form part of the non-doped section. In this embodiment, the non-doped section is located between the first well region and the second well region.

The sequential fabrication process 700 includes patterning the substrate to form one or more semiconductor fin structures on the substrate orthogonal to the non-doped section (705). In this embodiment, the first well region and the second well region are beneath the one or more semiconductor fin structures. In one or more implementations, the one or more semiconductor fin structures respectively have a channel stop region and a channel region above the channel stop region. The channel stop region has at least a portion of the non-doped section and at least a portion of the well region. The channel region may be directly above the at least a portion of the non-doped section. In one or more aspects, the one or more semiconductor fin structures respectively have a planar channel formed along a longitudinal axis of the channel region at an interface between the at least a portion of the non-doped section and the channel region for additional current flow through the planar channel. The one or more semiconductor fin structures can respectively have a threshold voltage decrease based on an increase in size of the at least a portion of the non-doped section along the longitudinal axis.

The sequential fabrication process 700 includes forming an isolation layer adjacent to and in contact with at least the well region and the channel stop region (706). The sequential fabrication process 700 also includes forming a gate structure on at least a portion of the isolation layer and around at least a portion of the channel region (707).

The sequential fabrication process 700 may include forming a deep n-well layer on the substrate to allow further additional current through the planar channel thereby yielding a lower threshold voltage for the FinFET device. In this embodiment, the deep n-well layer may be disposed beneath the first well region and the second well region.

The subject technology may provide methods and implementations for a planar channel in multi-gate devices. In one or more implementations, the subject technology achieves lower threshold devices by forming a planar channel under the FinFET channel. By blocking a section of the substrate under the FinFET channel to well implantation, the formed planar channel has a significantly lower doping concentration compared to the rest of the well layer of the fin and surrounding well. The blocked section allows an increase in current flow through the channel thereby allowing a decrease in achievable threshold voltages for the FinFET device. In this regard, the threshold voltage is inversely proportional to the width size of the blocked section. For example, the threshold voltage decreases as the blocked section increases in width along a longitudinal axis of the fin. The advantageous features of the disclosure include compatibility with the existing FinFET-based and/or lateral double-diffused MOS (LDMOS)-based CMOS device fabrication process flows without requiring any additional masks.

A semiconductor device includes a substrate having at least one well region implanted with a first dopant by a first well implantation and a non-doped section blocked from the first well implantation; one or more semiconductor fin structures formed on the substrate, the at least one semiconductor fin structure having a channel stop region and a channel region above the channel stop region, the channel stop region having at least a portion of the non-doped section and at least a portion of the well region, the at least one semiconductor fin structure having a planar channel formed at an interface between the at least a portion of the non-doped section and the channel region for additional current flow between source and drain regions of the at least one semiconductor fin structure; an isolation layer disposed adjacent to and in contact with at least the well region and the channel stop region; and a gate structure disposed on at least a portion of the isolation layer and around at least a portion of the channel region.

A semiconductor device includes a substrate and a first well region in the substrate, the first well region implanted with a first dopant by a first well implantation; a second well region in the substrate, the second well region implanted with a second dopant different from the first dopant by a second well implantation, the second well region located adjacent to the first well region along a channel axis; one or more semiconductor fin structures formed on the substrate, the at least one semiconductor fin structure having a channel stop region and a channel region above the channel stop region, the channel stop region having a non-doped section blocked from the first well implantation and the second well implantation, the at least one semiconductor fin structure having a planar channel formed at an interface between the non-doped section and the channel region for additional current flow between source and drain regions of the at least one semiconductor fin structure; an isolation layer disposed adjacent to and in contact with at least the well region and the channel stop region; and a gate structure disposed orthogonal to the channel axis on at least a portion of the isolation layer and around at least a portion of the channel region.

A method of fabricating a semiconductor device includes providing a substrate; forming a mask layer on at least a first portion of the substrate; implanting a dopant on the substrate to form a well region in the substrate by a well implantation, the at least a portion of the substrate beneath the mask layer being blocked from the well implantation to form a non-doped section; patterning the substrate to form one or more semiconductor fin structures on the substrate orthogonal to the non-doped section, the one or more semiconductor fin structures respectively having a channel stop region and a channel region above the channel stop region, the channel stop region having at least a portion of the non-doped section and at least a portion of the well region, the channel region being directly above the at least a portion of the non-doped section, the one or more semiconductor fin structures respectively having a planar channel formed along a longitudinal axis of the channel region at an interface between the at least a portion of the non-doped section and the channel region for additional current flow through the planar channel, the one or more semiconductor fin structures respectively having a threshold voltage decrease based on an increase in size of the at least a portion of the non-doped section along the longitudinal axis; forming an isolation layer adjacent to and in contact with at least the well region and the channel stop region; and forming a gate structure on at least a portion of the isolation layer and around at least a portion of the channel region.

It is noted that dimensional aspects provided above are examples and that other values for the dimensions can be utilized in accordance with one or more implementations. Furthermore, the dimensional aspects provided above are generally nominal values. As would be appreciated by a person skilled in the art, each dimensional aspect, such as a width of a non-doped section, has a tolerance associated with the dimensional aspect. For example, in terms of a width of a non-doped section, the tolerance can be a function of the process utilized in implanting a well dopant or etching a doped substrate.

One or more implementations are performed by one or more integrated circuits, such as application specific integrated circuits (ASICs) or field programmable gate arrays (FPGAs). In one or more implementations, such integrated circuits execute instructions that are stored on the circuit itself. The term "integrated circuit" or "semiconductor device" may include, but is not limited to, a design tool output file as binary code encompassing the overall physical design of the integrated circuit or semiconductor device, a data file encoded with code representing the overall physical design of the integrated circuit or semiconductor device, a packaged integrated circuit or semiconductor device, or an unpackaged die. The data file can include elements of the integrated circuit or semiconductor device, interconnections of those elements, and timing characteristics of those elements (including parasitics of the elements).

The predicate words "configured to" and "operable to" do not imply any particular tangible or intangible modification of a subject, but, rather, are intended to be used interchangeably. Terms such as "top", "bottom", "front", "rear", "side", "horizontal", "vertical", and the like refer to an arbitrary frame of reference, rather than to the ordinary gravitational frame of reference. Thus, such a term may extend upwardly, downwardly, diagonally, or horizontally in a gravitational frame of reference.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect may refer to one or more aspects and vice versa, and this applies similarly to other phrases.

Any implementation described herein as an "example" is not necessarily to be construed as preferred or advantageous over other implementations. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A semiconductor device, comprising:
   a substrate having at least one well region implanted with a first dopant by a first well implantation and a non-doped section blocked from the first well implantation;
   at least one semiconductor fin structure formed on the substrate, the at least one semiconductor fin structure having a channel stop region and a channel region above the channel stop region, the channel stop region having at least a portion of the non-doped section and at least a portion of the well region, the at least one semiconductor fin structure having a planar channel formed at an interface between the at least a portion of the non-doped section and the channel region for additional current flow between source and drain regions of the at least one semiconductor fin structure;
   an isolation layer disposed adjacent to and in contact with at least the well region and the channel stop region; and
   a gate structure disposed on at least a portion of the isolation layer and around at least a portion of the channel region.

2. The semiconductor device of claim 1, wherein the at least one semiconductor fin structure has a threshold voltage that is directly proportional to a width of the non-doped section.

3. The semiconductor device of claim 2, wherein the width of the non-doped section is in a range of at least 1 nanometer up to a width corresponding to a desired threshold voltage.

4. The semiconductor device of claim 1, wherein the non-doped section has a width greater than that of the gate structure.

5. The semiconductor device of claim 1, further comprising a deep n-well layer in contact with the substrate, the deep n-well layer disposed between the well region and the substrate.

6. The semiconductor device of claim 1, wherein at least a portion of the channel region beneath the gate structure is directly above the at least a portion of the non-doped section.

7. The semiconductor device of claim 1, further comprising a second well region implanted with a second dopant different from the first dopant by a second well implantation, the non-doped section being between the well region and the second well region.

8. A semiconductor device, comprising:
   a substrate;
   a first well region in the substrate, the first well region implanted with a first dopant by a first well implantation;
   a second well region in the substrate, the second well region implanted with a second dopant different from the first dopant by a second well implantation, the second well region located adjacent to the first well region along a channel axis;
   at least one semiconductor fin structure formed on the substrate, the at least one semiconductor fin structure having a channel stop region and a channel region above the channel stop region, the channel stop region having a non-doped section blocked from the first well implantation and the second well implantation, the at least one semiconductor fin structure having a planar channel formed at an interface between the non-doped section and the channel region for additional current flow between source and drain regions of the at least one semiconductor fin structure;
   an isolation layer disposed adjacent to and in contact with at least the well region and the channel stop region; and
   a gate structure disposed orthogonal to the channel axis on at least a portion of the isolation layer and around at least a portion of the channel region.

9. The semiconductor device of claim 8, wherein the at least one semiconductor fin structure has a threshold voltage with a non-linear relationship to a width of the non-doped section.

10. The semiconductor device of claim 8, wherein at least a portion of the channel region beneath the gate structure is directly above the non-doped section, and wherein a width of the non-doped section is in a range of at least 1 nanometer up to a width corresponding to a desired threshold voltage.

11. The semiconductor device of claim 8, further comprising a deep n-well layer in contact with the substrate, the deep n-well layer disposed in contact with the first well region and the second well region.

12. A method of fabricating a semiconductor device, the method comprising:
   providing a substrate having at least one well region doped with a first dopant and a non-doped section;
   forming one or more semiconductor fin structures on the substrate, the one or more semiconductor fin structures respectively having a channel stop region and a channel region above the channel stop region, the channel stop region having at least a portion of the non-doped section and at least a portion of the well region, the one or more semiconductor fin structures respectively having a planar channel formed at an interface between the at least a portion of the non-doped section and the channel region for additional current flow between source and drain regions of the one or more semiconductor fin structures;
   forming an isolation layer adjacent to and in contact with at least the well region and the channel stop region; and
   forming a gate structure on at least a portion of the isolation layer and around at least a portion of the channel region.

13. The method of claim 12, further comprising:
   patterning the substrate to form the one or more semiconductor fin structures on the substrate;
   recessing a portion of the substrate to form a recessed region;
   disposing a mask layer into the recessed region; and
   disposing the first dopant on the substrate to form the well region in the substrate, the recessed portion beneath the mask layer being blocked from the disposed first dopant.

14. The method of claim 13, further comprising:
   disposing a dummy material into the recessed region, the mask layer being disposed on the dummy material;
   removing the dummy material after the well region is formed; and disposing a semiconductor material into the recessed region to form the non-doped section.

15. The method of claim 13, further comprising:
removing the mask layer by an etch operation before the gate structure is formed.

16. The method of claim 15, wherein the mask layer is removed before the patterning of the substrate.

17. The method of claim 13, wherein the patterning of the substrate comprises:
patterning the substrate to form one or more semiconductor structures;
disposing a dielectric material around and in contact with the one or more semiconductor structures;
recessing the one or more semiconductor structures to form respective recessed regions;
disposing a semiconductor material into the respective recessed regions to form the one or more semiconductor fin structures;
recessing the dielectric material to form the isolation layer; and disposing a second dopant on the semiconductor material to form the channel region, the channel region having a doping concentration smaller than that of the channel stop region and the well region, the channel stop region having a doping concentration same as that of the well region.

18. The method of claim 12, further comprising:
forming a second well region in the substrate, the non-doped section being between the well region and the second well region, the second well region being beneath the one or more semiconductor fin structures.

19. The method of claim 18, wherein the forming of the second well region comprises:
disposing a third dopant on the substrate to form the second well region in the substrate, the third dopant being different from the first dopant.

20. The method of claim 12, further comprising:
disposing a deep n-well layer on the substrate, the deep n-well layer disposed between the well region and the substrate.

* * * * *